United States Patent
Atia

(10) Patent No.: US 6,721,098 B2
(45) Date of Patent: Apr. 13, 2004

(54) TRIPLE ELECTRODE MOEMS TUNABLE FILTER AND FABRICATION PROCESS THEREFOR

(75) Inventor: Walid A. Atia, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/748,625

(22) Filed: Dec. 22, 2000

(65) Prior Publication Data

US 2002/0080504 A1 Jun. 27, 2002

(51) Int. Cl.[7] .............................................. G02B 27/00
(52) U.S. Cl. ....................................... 359/578; 359/577
(58) Field of Search ................................ 359/290, 291, 359/295, 223, 224, 578, 579, 577; 372/20, 108; 356/454, 519

(56) References Cited

U.S. PATENT DOCUMENTS

| | | | | |
|---|---|---|---|---|
| 5,022,745 A | * | 6/1991 | Zayhowski et al. | ......... 359/847 |
| 5,251,275 A | * | 10/1993 | Kuriyama et al. | ............ 385/14 |
| 5,559,358 A | * | 9/1996 | Burns et al. | ................ 257/431 |
| 5,589,689 A | * | 12/1996 | Koskinen | ............... 250/339.01 |
| 5,629,951 A | | 5/1997 | Chang-Hasnain et al. | .... 372/20 |
| 6,078,395 A | | 6/2000 | Jourdain et al. | ............ 356/352 |
| 6,373,632 B1 | * | 4/2002 | Flanders | ..................... 359/578 |
| 2002/0031155 A1 | * | 3/2002 | Tayebati et al. | .............. 372/50 |

FOREIGN PATENT DOCUMENTS

| | | | | |
|---|---|---|---|---|
| JP | 11248934 A | * | 9/1999 | ........... G02B/05/28 |
| WO | WO 99/34484 | | 7/1999 | |

OTHER PUBLICATIONS

Pfeiffer, J., et al., "Tunable Wavelength–Selective WDM Photodetector Based on MOEMS," *Annual Report Technical University*, pp. 94–98 (1999).

* cited by examiner

*Primary Examiner*—Thong Nguyen
*Assistant Examiner*—Arnel C. Lavarias
(74) *Attorney, Agent, or Firm*—J. Grant Houston

(57) ABSTRACT

A MOEMS Fabry-Perot tunable filter includes an optical membrane structure. Two electrostatic cavities are provided, one on either side of the membrane structure. As a result, electrostatic attractive forces can be exerted on the optical membrane to enable deflection in either direction, typically, along the optical axis. This is useful in calibrating the tunable filter during operation to an initial wavelength ($\lambda_o$) set point. It is also useful in controlling the membrane to avoid unstable operation.

27 Claims, 3 Drawing Sheets

TRIPLE ELECTRODE MOEMS TUNABLE FILTER AND FABRICATION PROCESS THEREFOR

BACKGROUND OF THE INVENTION

Micro-optical electromechanical system (MOEMS) membranes are used in a spectrum of optical applications. For example, they can be coated to be reflective and then paired with a stationary mirror to form a tunable Fabry-Perot (FP) cavity/filter. They can also be used as stand-alone reflective components to define the end of a laser cavity, for example. They can be used as tip/tip-tilt mirrors in switches.

The MOEMS membranes are typically produced by depositing a membrane structure over a sacrificial layer, which has been deposited on a support structure. This sacrificial layer is subsequently etched away to produce a suspended membrane structure in a release process. Often the membrane layer is a silicon compound and the sacrificial layer can be polyimide, for example.

Typically, membrane deflection is achieved by applying a voltage between the membrane and a fixed electrode on the support structure. Electrostatic attraction moves the membrane in the direction of the fixed electrode as a function of the applied voltage. This results in changes in the reflector separation of the FP filter or cavity length in the case of a laser.

SUMMARY OF THE INVENTION

In typical operation in an FP filter, a mode within an order of operation of the tunable filter is scanned across some spectral band of interest. For example, in dense wavelength division multiplexing (DWDM) systems such as defined by the current ITU (International Telecommunications Union) grid, channel slots are defined between approximately 1490 nanometers (nm) and 1620 nm, for the L, C, and S bands. If the filter were designed to scan, for example, the C band, it would be desirable to place a mode of the filter at 1570 nm at a zero Volts condition, for example, and then scan that mode by deflecting the membrane to approximately 1530 nm by ramping the electrostatic drive voltage. Similarly, if a full L, C and S band scan is to be performed, it would be desirable to spectrally place the mode of the filter at approximately 1490 nm for zero Volts and then scan it to approximately 1611 nm by ramping the voltage.

For reasons associated with MOEMS filter fabrication, however, the operation of the tunable filter is slightly more complex. The spacing between orders of operation for a filter is termed the filter's free spectral range (FSR). This FSR is typically determined by a spacer layer(s) between the optical membrane and stationary reflector. The location of the filter's modes typically depends upon the curvature of the reflectors of the FP cavity. In order to determine the location of the filter passband at rest, when there is no electrostatic field in the cavity, both the membrane/reflector spacing and reflector curvatures need to be specified to high levels of accuracy, for example, within a few nanometers.

Another related issue concerns the physical distance over which the membrane can be deflected. There are typically limitations in the voltages that are available to electrostatically deflect the membrane. For example, many times the systems are designed to run only on a few Volts. Moreover, there can be limitations associated with the stability of the membrane. For example, general electrostatic deflection cavity design parameters specify that a membrane should typically only be deflected over approximately one third of the cavity width to avoid unstable operation.

The present invention concerns a MOEMS Fabry-Perot tunable filter. As is common, it includes an optical membrane structure. Two electrostatic cavities are provided, however, one on either side of the membrane structure. As a result, electrostatic attractive forces can be exerted on the optical membrane to enable deflection in either direction, typically, along the optical axis. This is useful in calibrating the tunable filter during operation to a desired initial wavelength ($\lambda_o$) set point. It is also useful in controlling the membrane to avoid unstable operation.

In general, according to one aspect, the invention concerns a triple electrode MOEMS Fabry-Perot tunable filter. It comprises an optical membrane, including a membrane electrode. A first stationary electrode supports an electrical field to deflect the optical membrane in a first direction and a second stationary electrode supports an electrical field to deflect the membrane in a second direction.

In one embodiment, the membrane electrode comprises a conductive layer on the optical membrane. In the typical embodiment, the optical membrane structure itself is conductive to thereby function as the membrane electrode, however. This can be achieved in the context of semiconductor-based devices by controlling the doping of the layer that is used to form the optical membrane structure.

In one embodiment, the optical membrane structure is vaulted to form a hemispherical Fabry-Perot cavity. In another embodiment, it is substantially planar to form a flat reflector of a hemispherical Fabry-Perot cavity.

According to other aspects of the present embodiments, the first stationary electrode comprises a conductor layer on a support wafer. Alternatively, in another embodiment, a support wafer structure is rendered conductive to function as a first stationary electrode.

According to another aspect of one of the embodiments, a reflector of a Fabry-Perot filter comprises a dielectric mirror structure that is deposited on a support wafer structure. Alternatively, an optical port can be formed in a support wafer structure and a mirror attached to the support wafer structure, typically with an intervening spacer layer, to define a Fabry-Perot cavity between the mirror and the membrane structure.

In general, according to another aspect, the invention also features a tunable filter. This filter comprises a support wafer structure and an optical membrane structure, including a membrane electrode that is attached to the support wafer structure. A first electrostatic cavity is provided between the support wafer and a proximal side of the optical membrane structure. A second stationary electrode defines a second electrostatic cavity on a distal side of the membrane structure.

In general, according to still another aspect, the invention concerns a triple electrode optical membrane. This membrane comprises an optical membrane structure, including a membrane electrode. First and second stationary electrodes are provided to deflect the membrane in either direction along an axis that is orthogonal to a surface of the membrane.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
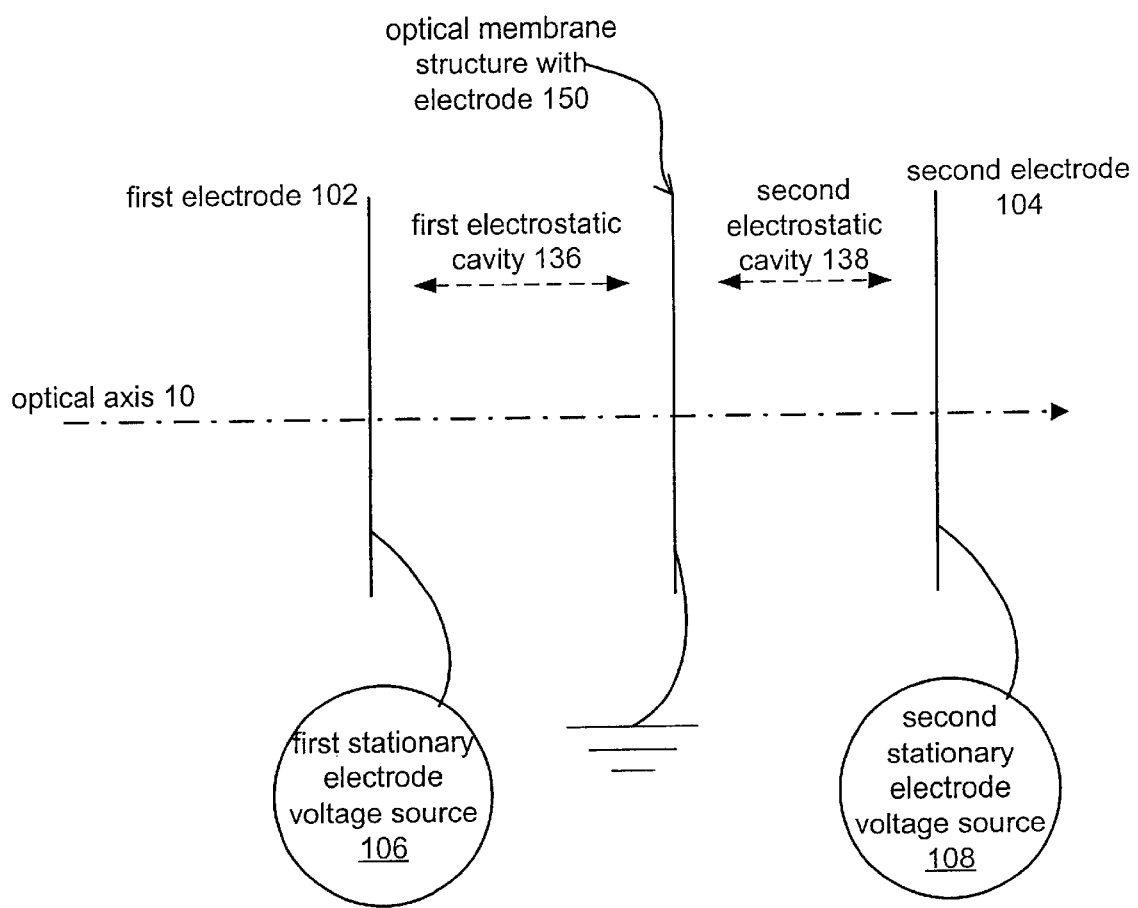
FIG. 1 is a schematic diagram illustrating a three-electrode optical membrane structure according to the present invention.

FIG. 1 shows an optical membrane structure having two electrostatic cavities, which has been constructed according to the principles of the present invention. Specifically, an optical membrane structure 150 with electrode is provided on an optical axis 10. Usually this optical axis extends orthogonally to a plane of the membrane. Typically, this optical membrane structure will be coated to be optically reflective. Common coating techniques include metal layers and/or multilayer dielectric mirrors. Dielectric mirrors have the advantage of providing high reflectivity with low absorption, as typically required in high finesse devices.

A first electrostatic cavity 136 and a second electrostatic cavity 138 are provided on a proximal and a distal side, respectively, of the optical membrane structure 150. In the illustrated embodiment, the optical membrane structure is electrically grounded. The voltage between the optical membrane structure 150 and a first stationary electrode 102 is controlled by a first stationary electrode voltage source 106. The second electrostatic cavity 138 extends between the optical membrane structure 150 and a second stationary electrode 104 on the distal side of the membrane structure 150. The voltage across the second electrostatic cavity 138 is controlled by a second stationary electrode voltage source 108.

During operation, in one configuration, the optical membrane structure 150 with the two electrostatic cavities 136, 138 is used such that the first electrostatic cavity 136 and the second electrostatic cavity 138 function in a pull—pull mode. For example, the first stationary electric voltage sources 106 is used to bias the membrane in one direction, while the second source 108 is then used to modulate the membrane position by pulling the membrane through its zero voltage position and further deflect it beyond that position. Alternatively, the first voltage source 106 is used as the drive source and the second source is used as the bias source.

Figure 2:
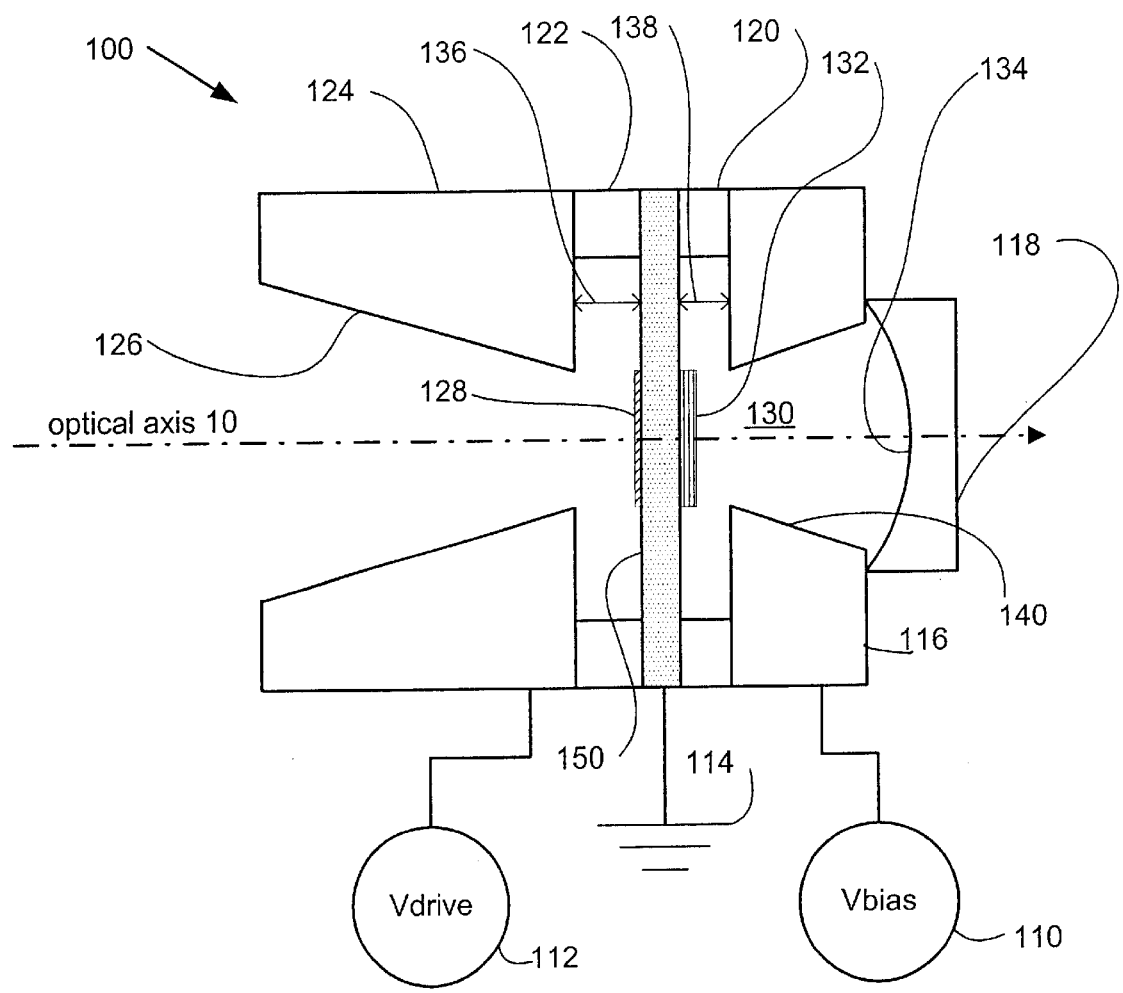
FIG. 2 is a schematic cross-sectional view showing a Fabry-Perot tunable filter having two electrostatic cavities on either side of the optical membrane.

FIG. 2 shows a MOEMS Fabry-Perot tunable filter 100, which implements the principles of the present invention.

Generally, the Fabry-Perot tunable filter 100 comprises a support structure 124. In the present implementation, this support structure is fabricated from semiconductor wafer material, such as doped silicon wafer material.

The optical membrane structure 150 is connected to the support structure 124. In the illustrated embodiment, a first electrostatic cavity spacer layer 122 separates the membrane structure 150 from the support structure 124 and thus defines the first electrostatic cavity 136. In the current implementation, this first spacer layer 122 is manufactured from a sacrificial release layer that is partially removed during the fabrication process to release the membrane structure 150 from the support structure 124.

The first spacer layer 122 is preferably manufactured from a nonconducting material. In the present implementation, it is silicon oxide. Alternatively, other materials are used in other embodiments. For example, silicon nitride is an alternative, along with polyimide, for example.

In the present embodiment, the first spacer layer 122 is between 2 and 5 $\mu$m in thickness. Presently, the thickness is between 3.5 and 4.5 $\mu$m thick, with a nominal thickness of about 4 $\mu$m.

A second spacer layer 120 defines the second electrostatic cavity 138. In one implementation, the second electrostatic cavity spacer layer 120 is another silicon oxide layer. In the present embodiment, it is less than 2 micrometers ($\mu$m) in thickness. In the present embodiment, the second spacer layer 120 is about 1 $\mu$m thick.

A mirror spacer structure 116 separates the second spacer layer 122 from a concave mirror structure 118. Preferably, the internal surface 134 of this mirror structure 118 has been coated to be highly reflective. Presently, a seven to twenty-one layer dielectric mirror is formed on the inner surface 134 to provide a high finesse, low absorption optical reflector.

The total thickness of the second electrostatic cavity spacer layer 120 and the mirror spacer layer 116 define the length of the Fabry-Perot cavity between the inner surface 134 of the mirror structure 118 and a membrane mirror structure 132 that is deposited on the membrane structure 150. This membrane mirror structure 132 is also preferably a high reflectivity, low absorption multilayer dielectric mirror structure, such as a seven to twenty-one layer dielectric stack. In the preferred embodiment, the FP cavity length is 10 to 40 $\mu$m, preferably about 10 to 20 $\mu$m, with a nominal mirror separation of about 16 $\mu$m in the current embodiment. Generally, however, these distances are dependent on the desired FSR.

In the illustrated embodiment, the optical beam that is launched into the Fabry-Perot cavity 130 enters the cavity 130 from the left. In the illustrated embodiment, an optical port 126 is manufactured in the support structure 124. This may or may not be necessary depending upon the transmissivity of the support structure 124 to the wavelengths of interest.

In the preferred embodiment, an antireflection (AR) coating 128 is deposited on the proximal side of the membrane structure 150 in order to reduce reflections at the first membrane interface to maximize radiation coupled into the Fabry-Perot cavity 130.

Further, according to the illustrated embodiment, the Fabry-Perot cavity 130 is what is sometimes referred to as a hemispherical cavity, with the first reflector, defined by the membrane 150, being substantially planar and a curved reflector being defined by the surface 134 of the mirror structure 118.

According to further aspects of the illustrated embodiment, a drive voltage or tuning voltage is established between a preferably grounded (see reference 114) membrane structure 1150 and the support structure 124. The drive voltage can be either directly applied to the support structure 124 in the case where the support structure is conductive, being manufactured from doped wafer material. Alternatively, electrodes can be deposited on the distal side of the support structure 124, i.e. the part of the support structure that faces the first electrostatic cavity 136.

According to further aspects of the illustrated embodiment, a bias voltage generator 110 is connected to the mirror spacer structure 116. Again, this structure has either bulk conductivity, or alternatively conductive electrodes are placed, such as deposited on, a proximal side of the mirror spacing structure 116 on the side of the structure that faces the second electrostatic cavity 138.

This preferred embodiment has advantages surrounding the fact that the FP cavity does not overlap the electrostatic cavity that is used as the drive voltage cavity. Therefore, the parameters of the electrostatic cavity are optimized without impacting the optimization of the FP cavity.

In other embodiments, the drive voltage 112 is applied to the mirror spacing structure 116 and the bias voltage applied to the support structure 124. In the present implementation, because of the relative thicknesses of the cavity spacer layer 122 and the second cavity spacer layer 120, drive voltage is preferably applied to the support structure 124.

In still another embodiment, drive voltages can be applied to both the support structure 124 and the mirror structure spacer layer 116 so that the membrane is deflected in a pull—pull arrangement.

One artifact of fabrication to note is the fact that the optical port 126 in the support structure 124 can be used as a shadow mask in the deposition of the membrane AR coating 128. Similarly, before the installation of the mirror structure 118, the optical port 140 in the mirror spacer structure 116 can be used as a shadow mask in the deposition of the membrane HR coating 132.

Depending on the rigidity of the layer that is used to form the membrane structure 150, tethers can be provided between a center portion of the membrane structure that is coincident with the optical axis 10 and the part of the membrane structure that is between spacer layers 122 and 120. In one embodiment, radial tethers are used. In another embodiment, spiral tethers are used extending between the outside portion of the membrane structure inward to the center of optical membrane structure.

According to one fabrication method for the first embodiment, the wafer assembly starts with a base handle wafer (Wafer A), which will become the supporting structure 124 for the entire device. Currently it is produced from a standard n-type doped silicon wafer. Typically, this silicon wafer is 75 mm–150 mm in diameter and 400–500 microns thick. The wafer is oxidized to a depth of typically 2–4.5 microns to form the first spacer layer 122. The maximum tuning range is ~33% of this oxide thickness and the required maximum tuning voltage is inversely proportional to the square of the thickness (as is typical for electrostatic drives).

A second n-type doped silicon wafer (Wafer B) is bonded to the handle wafer using elevated temperature and mechanical pressure. This second wafer will become the electrostatically deflectable membrane 150. It is typically mechanically ground to a thickness of 4–7 $\mu$m. After grinding, the surface of the second wafer is oxidized to a thickness of typically 0.5–4.0 $\mu$m. This second oxide layer will be patterned to be the second cavity spacer layer 120. A preferred thickness of 3.0 to 4.0 $\mu$m will yield the ability to bias the membrane position by about 1.0 $\mu$m as is required for typical WDM applications in which the maximum wavelength is about 1620 nanometers. A membrane and tether pattern is preferably etched into the oxide grown on the second wafer.

A third n-type doped silicon wafer is bonded to the oxide on the second wafer, again using elevated temperature and mechanical pressure. This wafer will become the second spacer layer 116 that defines the free spectral range of the FP filter cavity in combination with the thickness of the second oxide layer 120. The third wafer "buries" the membrane-patterned oxide on Wafer B and is subsequently ground to a thickness of typically 6–20 $\mu$m, which is appropriate to the mirror-to-mirror spacing of the curved mirror-flat mirror Fabry-Perot optical cavity.

Typically, the optical port 126 is patterned and etched into the support wafer 124, using a combination of isotropic and anisotropic etching. The oxide, first spacer layer 122 is used as an etch stop. Alternatively, the optical port etch step can be omitted, as silicon is partially transparent at infrared wavelengths. In such case, an anti-reflective (AR) coating is applied to the outer surface of Wafer A to minimize reflection from the air-silicon interface.

The resulting structure is subjected to an isotropic oxide etchant to "release" the membrane and tether structure from the first spacer oxide layer 122 and the etch-stop oxide is removed from the openings forming the spacer and contact. A typical implementation would use concentrated HF followed by methanol, followed by a drying step using super-critical carbon dioxide. A high reflectivity (HR) multi-layer dielectric mirror 132 is deposited through the spacer opening 140 onto the membrane interior surface using the port 140 as a mask. An anti-reflection (AR) 128 coating is similarly deposited through the optical port 126 onto the exterior surface of the membrane. Both of these coatings must be designed for the wavelength bands of interest.

Next, electrical contacts are deposited on the backside of support wafer 124 and in the contact opening to the membrane wafer layer 150, typically using aluminum or a refractory metal.

A concave, highly polished micro-mirror 118, preferably made using a mass-transport process, is installed on top of the spacer layer. The mirror has an HR coating on its interior surface (and AR coating on its exterior surface) so it forms a precision, high finesse optical cavity in conjunction with the membrane structure 150. High parallelism and accurate spacing is maintained because of the uniformity of the spacer grinding thickness. The mirror attachment can be performed using AuSn attachment layers.

For the second embodiment, the wafer assembly again begins with the attachment of Wafers A and B and the subsequent oxidation of Wafer B to form the second cavity spacer layer.

Setting aside this structure, a separate, 400–500 micron thick, n-type doped silicon wafer (Wafer C) of the same size as the bonded wafers is oxidized (or receives deposited oxide which is subsequently densified) to a thickness, typically 0.5–1.0 micron. Wafer C is patterned and the oxide thickness is etched to form a deflectable mirror membrane and tether pattern. Another n-type doped silicon wafer (Wafer D) is bonded to Wafer C. (Wafer D "buries" the membrane-patterned oxide on Wafer C). Wafer D is ground to a thickness suitable for an electrostatically deflectable silicon membrane thickness, typically 4–8 microns. The ground surface of Wafer D is bonded to the oxidized surface of Wafer B using elevated temperature and mechanical pressure. Wafer C is subsequently ground to a thickness of typically 6–20 micron, appropriate to the mirror-to-mirror spacing of the curved mirror-flat mirror Fabry-Perot optical cavity.

Optical port 126 is patterned and etched into Wafer A. A spacer and electrical contact pattern is etched into Wafer C, using the oxide as the etch stop layer, followed by an anisotropic silicon etch to transfer the diaphragm and tether pattern from oxide into the underlying silicon. A typical implementation would use directional reactive ion etching for this step. The etch stop oxides are removed from the openings, releasing the diaphragm and tethers without wet etchant, thus avoiding the stiction caused by liquid surface tension.

The remaining steps are similar to those in the previous embodiment. A high reflectivity (HR) mirror layer is deposited through an appropriate shadow mask and the spacer opening onto the membrane surface, and an AR coating is deposited on the optical port side of the membrane. Electrical contacts are deposited on the surfaces of Wafer A and Wafer D, typically of aluminum or a refractory metal.

A curved mirror with an HR coating and patterned metallization (typically Ti-Au, 0.5 micron thickness) is attached to the spacer layer.

Figure 3:
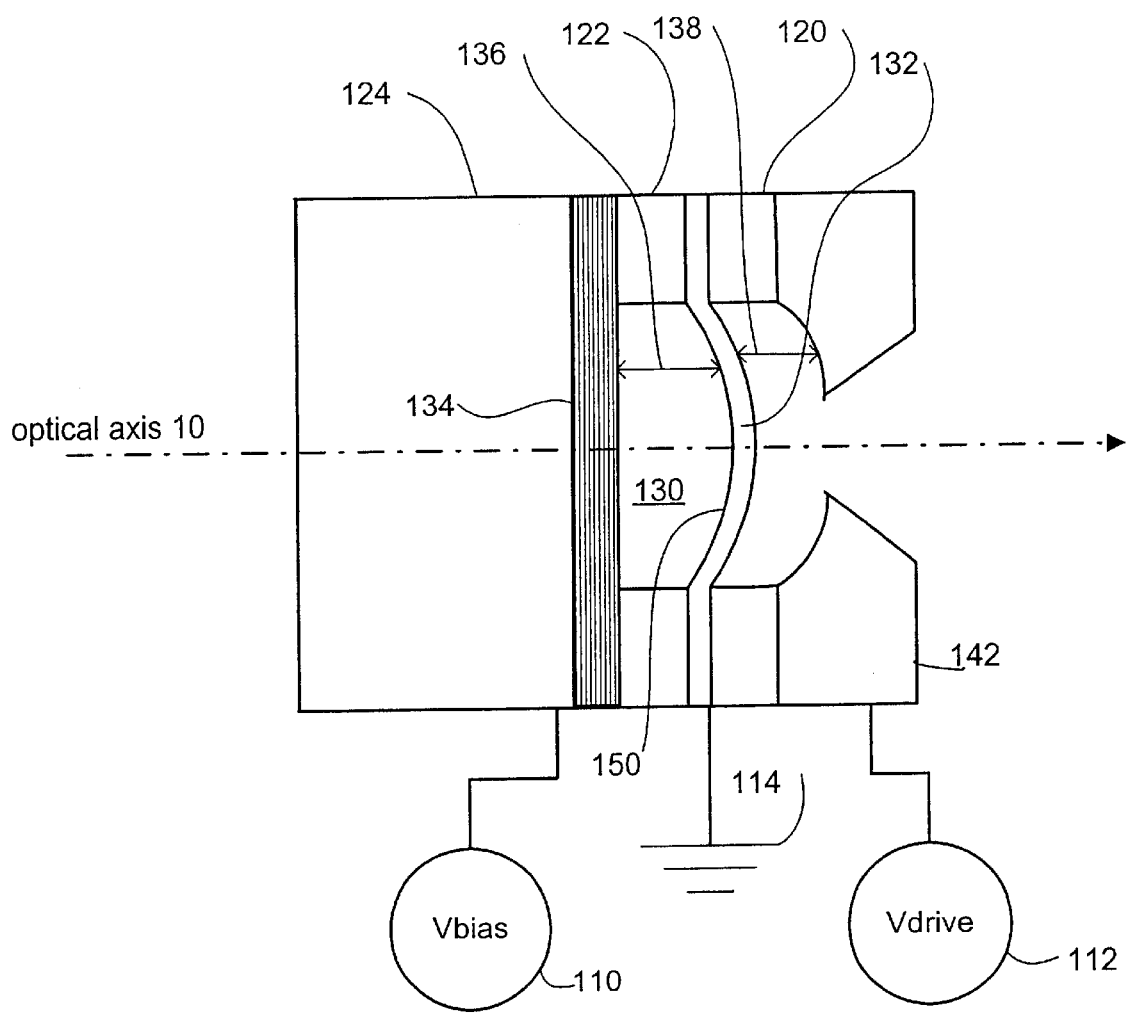
FIG. 3 is a schematic cross-sectional view showing a second embodiment of a two electrostatic cavity Fabry-Perot filter according to the present invention.

FIG. 3 shows another embodiment of the triple electrode Fabry-Perot filter according to the present invention. In this embodiment, no optical port is typically provided along the optical axis 10 in the support structure 124. Further, the stationary mirror structure 134 is deposited directly on the support structure 124.

To yield the hemispherical Fabry-Perot cavity configuration, the membrane structure 150 is vaulted in the direction away from the stationary mirror structure 134. This pimpling can be accomplished by controlling coating stress in the structure 150. The first spacer layer 122 that separates the vaulted membrane structure 150 from the port structure 124 defines both the electrostatic cavity 136 and the FP optical cavity between the stationary mirror structure 134 and a mirror structure that is formed as part of the membrane structure 150.

A second spacer layer 120 separates the membrane structure 150 from the second, cantilever electrode structure 142. In the illustrated embodiment, an optical port is provided in this electrode structure 142. The second electrostatic cavity 138 extends between the distal side of the membrane structure 150 and the cantilevered portions of the second electrode structure 142.

Again, depending on the rigidity of the layer that is used to form the membrane structures 150, tethers can be provided between a center portion of the membrane structure that is coincident with the optical axis 10 and the part of the membrane structure that is between spacer layers 122 and 120. In one embodiment, radial tethers are used. In another embodiment, spiral tethers extend between the outside portion of the membrane structure and the center optical membrane.

While this invention has been particularly shown and described with references to preferred embodiments thereof, it will be understood by those skilled in the art that various changes in form and details may be made therein without departing from the scope of the invention encompassed by the appended claims.

What is claimed is:

1. A triple electrode, single optical cavity micro-optical electromechanical system (MOEMS) Fabry-Perot tunable filter, comprising:
    a support wafer structure on which a membrane layer and an intervening spacer layer have been formed, which extend orthogonally to an optical axis;
    an optical membrane structure, which has been formed in the membrane layer that is attached to the support wafer structure, the optical membrane structure including a membrane electrode and a reflective coating, the optical membrane structure being released from the support wafer structure by partial removal of the intervening spacer layer;
    a first stationary electrode for supporting a first electrical field to deflect the optical membrane in a first direction toward the support structure; and
    a second stationary electrode for supporting a second electrical field to deflect the optical membrane in a second direction.

2. A tunable filter as claimed in claim 1, wherein the membrane electrode comprises a conductive layer on the optical membrane structure.

3. A tunable filter as claimed in claim 1, wherein the optical membrane structure is conductive to function as the membrane electrode.

4. A tunable filter as claimed in claim 1, wherein the optical membrane structure is vaulted to form a hemispherical Fabry-Perot cavity.

5. A tunable filter as claimed in claim 1, wherein the optical membrane structure is substantially planar to form a flat reflector of a hemispherical Fabry-Perot cavity.

6. A tunable filter as claimed in claim 1, wherein the first stationary electrode comprises a conductive layer on a support wafer structure.

7. A tunable filter as claimed in claim 1, wherein a support wafer structure is conductive to function as the first stationary electrode.

8. A tunable filter as claimed in claim 1, wherein an electrostatic force generated between the optical membrane structure and the first stationary electrode deflects the optical membrane structure in a direction of a support wafer structure.

9. A tunable filter as claimed in claim 1, wherein an electrostatic force generated between the optical membrane structure and the first stationary electrode is used as a bias force to calibrate a size of a Fabry-Perot cavity of the Fabry-Perot tunable filter.

10. A tunable filter as claimed in claim 1, wherein an electrostatic force generated between the optical membrane structure and the first stationary electrode is used as a drive force to modulate a size of a Fabry-Perot cavity of the Fabry-Perot tunable filter to perform spectral scanning.

11. A tunable filter as claimed in claim 1, wherein one reflector of the Fabry-Perot filter comprises a dielectric minor structure that is deposited on a support wafer structure.

12. A tunable filter as claimed in claim 1, further comprising:
    an optical port formed in the support wafer structure; and
    a mirror connected to the support wafer to define a Fabry-Perot cavity between the mirror and the membrane structure.

13. A single optical cavity tunable filter, comprising:
    a support wafer structure on which an intervening spacer layer has been formed, which extends orthogonally to an optical axis;
    an optical membrane structure, including an optical coating and a membrane electrode, that is attached to the support wafer structure, the optical membrane structure being released from die support wafer structure by partial removal of the intervening spacer layer;
    a first electrostatic cavity between the support wafer and a proximal side of the optical membrane structure; and
    a second stationary electrode defining a second electrostatic cavity on a distal side of the membrane structure.

14. A tunable filter as claimed in claim 13, wherein the membrane electrode comprises a conductive layer on the optical membrane structure.

15. A tunable filter as claimed in claim 13, wherein the optical membrane structure is conductive to function as the membrane electrode.

16. A tunable filter as claimed in claim 13, wherein the optical membrane structure is vaulted to form a hemispherical Fabry-Perot cavity.

17. A tunable filter as claimed in claim 13, wherein the optical membrane structure is substantially planar to form a flat reflector of a hemispherical Fabry-Perot cavity.

18. A tunable filter as claimed in claim 13, wherein an electrostatic force generated between the optical membrane structure and a first stationary electrode on a mirror structure is used as a bias force to calibrate a size of a Fabry-Perot cavity of the tunable filter.

19. A tunable filter as claimed in claim 13, wherein an electrostatic force generated in the first electrostatic cavity is used as a drive force to modulate a size of a Fabry-Perot cavity to perform spectral scanning.

20. A tunable filter as claimed in claim 19, wherein a second electrostatic force generated in the second electrostatic cavity is used as a bias force to calibrate the size of a Fabry-Perot cavity.

21. A tunable filter as claimed in claim 13, wherein an electrostatic force generated in the first electrostatic cavity is used as a bias force to calibrate the size of a Fabry-Perot cavity.

22. A tunable filter as claimed in claim 21, wherein a second electrostatic force generated in the second electrostatic cavity is used as a drive force to modulate the size of a Fabry-Perot cavity to perform spectral scanning.

23. A tunable filter as claimed in claim 13, wherein one reflector of the tunable filter comprises a dielectric minor structure that is deposited on the support wafer structure.

24. A tunable filter as claimed in claim 13, wherein one reflector of the tunable filter comprises the optical coating, which is a dielectric mirror structure that is deposited on the membrane structure.

25. A tunable filter as claimed in claim 13, further comprising:
   an optical port that is formed in the support wafer structure; and
   a mirror attached to the support wafer to define a Fabry-Perot cavity between the mirror and the membrane structure.

26. A tunable filter as claimed in claim 25, further comprising: a spacer layer separating the mirror from the support wafer structure, the spacer layer functioning as the second stationary electrode.

27. A single optical cavity tunable filter, comprising:
   a support wafer structure on which an intervening spacer layer has been formed, which extends orthogonally to an optical axis;
   an optical membrane structure, including a membrane electrode, that is attached to the support wafer structure, and an optical coating, the optical membrane structure being released from the support wafer structure by partial removal of the intervening spacer layer;
   first electrostatic cavity means for deflecting the optical membrane structure in a first direction; and
   second electrostatic cavity means for deflecting the optical membrane in a second direction that is opposite the first direction.

* * * * *